United States Patent [19]

Hsia et al.

[11] Patent Number: 5,724,365
[45] Date of Patent: Mar. 3, 1998

[54] METHOD OF UTILIZING REDUNDANCY TESTING TO SUBSTITUTE FOR MAIN ARRAY PROGRAMMING AND AC SPEED READS

[75] Inventors: Edward Hsia; Darlene Hamilton, both of San Jose; Jose H. Hernandez, Milpitas, all of Calif.

[73] Assignee: Advanced Micro Devices, Inc., Sunnyvale, Calif.

[21] Appl. No.: 653,227

[22] Filed: May 24, 1996

[51] Int. Cl.$^6$ .................................................. G01R 31/28
[52] U.S. Cl. .......................................... 371/21.1; 365/201
[58] Field of Search ................................ 371/21.1, 21.3, 371/21.4; 324/73.1, 765; 365/201, 185.33, 218, 185.29; 209/571, 573; 395/183.01

[56] References Cited

U.S. PATENT DOCUMENTS

| | | | |
|---|---|---|---|
| 4,799,021 | 1/1989 | Cozzi | 324/73 R |
| 4,871,963 | 10/1989 | Cozzi | 324/73 R |
| 5,237,535 | 8/1993 | Mielke et al. | 365/218 |
| 5,538,141 | 7/1996 | Gross et al. | 209/571 |
| 5,581,510 | 12/1996 | Furusho et al. | 365/201 |

*Primary Examiner*—Robert W. Beausoliel, Jr.
*Assistant Examiner*—Nadeem Iqbal
*Attorney, Agent, or Firm*—H. Donald Nelson

[57] ABSTRACT

A method of testing Flash memory devices by performing wafer sort testing on main array cells and redundancy array cells of the Flash memory device and performing class testing on redundancy array cells only. There is a major savings of testing time with no decrease in quality of the final product.

16 Claims, 2 Drawing Sheets

METHOD OF UTILIZING REDUNDANCY TESTING TO SUBSTITUTE FOR MAIN ARRAY PROGRAMMING AND AC SPEED READS

BACKGROUND OF THE INVENTION

1. Field of the Invention

This invention relates generally to the testing of Flash memory and, more particularly, to a method of substituting the testing of redundancy cells in Flash memory for the testing of main array cells during class testing of the Flash memory.

2. Discussion of the Related Art

This application is related to application, Ser. No. 08/655,357 entitled "Method of Screening Hot Temperature Erase Rejects at Room Temperature" and application, Ser. No. 08/653,211 entitled "Method of Screening Hot Temperature Programming Rejects at Room Temperature" both applications having a common assignee with this application and filed on the same date as this application.

The standard test method used for Flash memory devices includes testing at the wafer level and testing after each individual die has been packaged. The wafer level testing is commonly done at room temperature and is called wafer sort. The package level testing is done after the wafer has been sawed into single dice and encapsulated in a package which is typically plastic. The package level testing is commonly called final test or class test and is done at an elevated temperature, usually from 70°–130° C. Once the package level or class test is complete the Flash memory devices that pass the class test are marked and shipped to the customer.

The wafer sort is used to remove or screen-out the die that have a defect or defects which occur during the fabrication of the Flash wafer. The wafer sort is used to ensure that only those die that have a possibility of being shipped to a customer are encapsulated in a package. This is done to control the package cost since bad die are not packaged.

The class testing is still necessary since the wafer sort is done at room temperature and some die are sensitive to operations at elevated temperatures. The operations that are most sensitive to elevated temperatures are speed sorting (a sort that determines the speed of the Flash memory device), programming, and certain low level leakage current testing. In addition, a part of class testing is to ensure that the encapsulation process did not damage the die.

A programming operation changes the logic state of a cell from a "1" (called "blank") to a logic "0" (called "programmed"). The programming and read operations are done at the byte level, that is, 8 or 16 cells (bits) at a time, on Flash devices. The erase operation changes the logic of the cell to a "1" or blank state. The erase operation is done on all cells in the array at the same time. To prevent "over-erasure" of an individual cell, all cells must be programmed to a logic "0" before the erase operation. Over-erasure of a cell can cause problems during subsequent programming and read operations and in some cases would prevent the cell from being programmed.

The Flash memory device must have all cells at a logic "1" when transferred to the class testing or when shipped to a customer. This means that if any cell is read as programmed, that is, read as a logic "0" then all cells must be programmed to a logic "0", read and programmed repeatedly until all cells are verified as reading "0". Once it is verified that all cells have been programmed all cells are erased, and reread to ensure all cells are blank, that is, read at a logic "1". Presently this is done at both wafer sort and class test.

The wafer sort and class test require lengthy test sequences due to the large number of memory cells that need to be read (a byte at a time), programmed (a byte at a time), read again (a byte at a time), erased (all at one time), and read again ( a byte at a time). Since the number of cells in a Flash memory device is commonly on the order of 1–2 million cells it can be appreciated why the wafer sort and class tests are lengthy test sequences. Furthermore, it is expected that the number of cells in a Flash memory device will increase in the future. It is typical that the sizes double, that is, from 1 MBits to 2 MBits to 4 MBits, etc. Therefore, it is expected that the next generations of Flash memory devices will be 4 MBits and 8 MBits, etc.

What is needed is a method of testing that can do away with the time consuming test methodology that requires the retesting of each and every cell at class testing. It is preferable to perform the testing that requires the testing of each and every cell at wafer sort and then only do the testing necessary at class test to ensure that the device is still good after being encapsulated in a package. The advantages that would be achieved are that the test time would decrease leading to lower product cost, increased production capacity as yields improve, and lower packaging costs per unit, all of which would result in increased efficiency.

SUMMARY OF THE INVENTION

In accordance with the present invention a method of testing Flash memory devices by performing wafer sort testing on main array cells and redundancy array cells of the Flash memory devices and performing class testing on redundancy array cells.

The class testing of the redundancy array cells includes ac functionality testing with ac speed reads and sorting the Flash memory devices in accordance with the ac speed reads.

During wafer sort, defective main array cells are replaced with functioning redundancy array cells and the Flash memory device retested. Before class testing is performed it is determined whether there are redundancy cells for class testing. If there are redundancy cells available class testing is done only on redundancy cells. If there are no redundancy cells available, class testing is performed on the main array cells.

Wafer sort testing includes testing for dc parametrics, programmability, erasability, and ac functionality of each Flash memory device. Identified defective cells are replaced with redundancy cells and the Flash memory device retested.

The present invention is better understood upon consideration of the detailed description below, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention,

Figure 1:
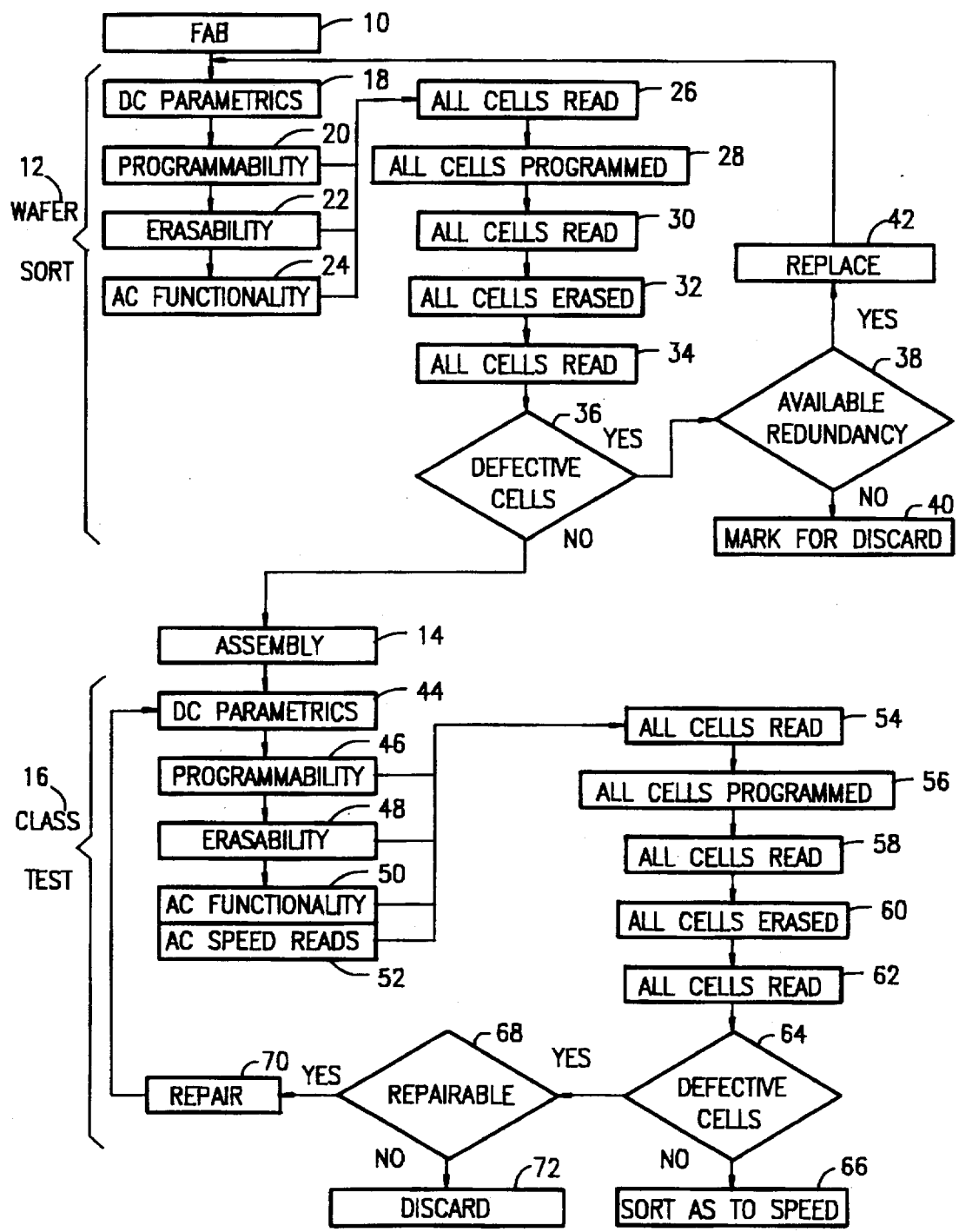

3 and together with the detailed description below serve to explain the principles of the invention. In the drawings:

FIG. 1 shows the prior art testing method for Flash memory devices.

Figure 2:
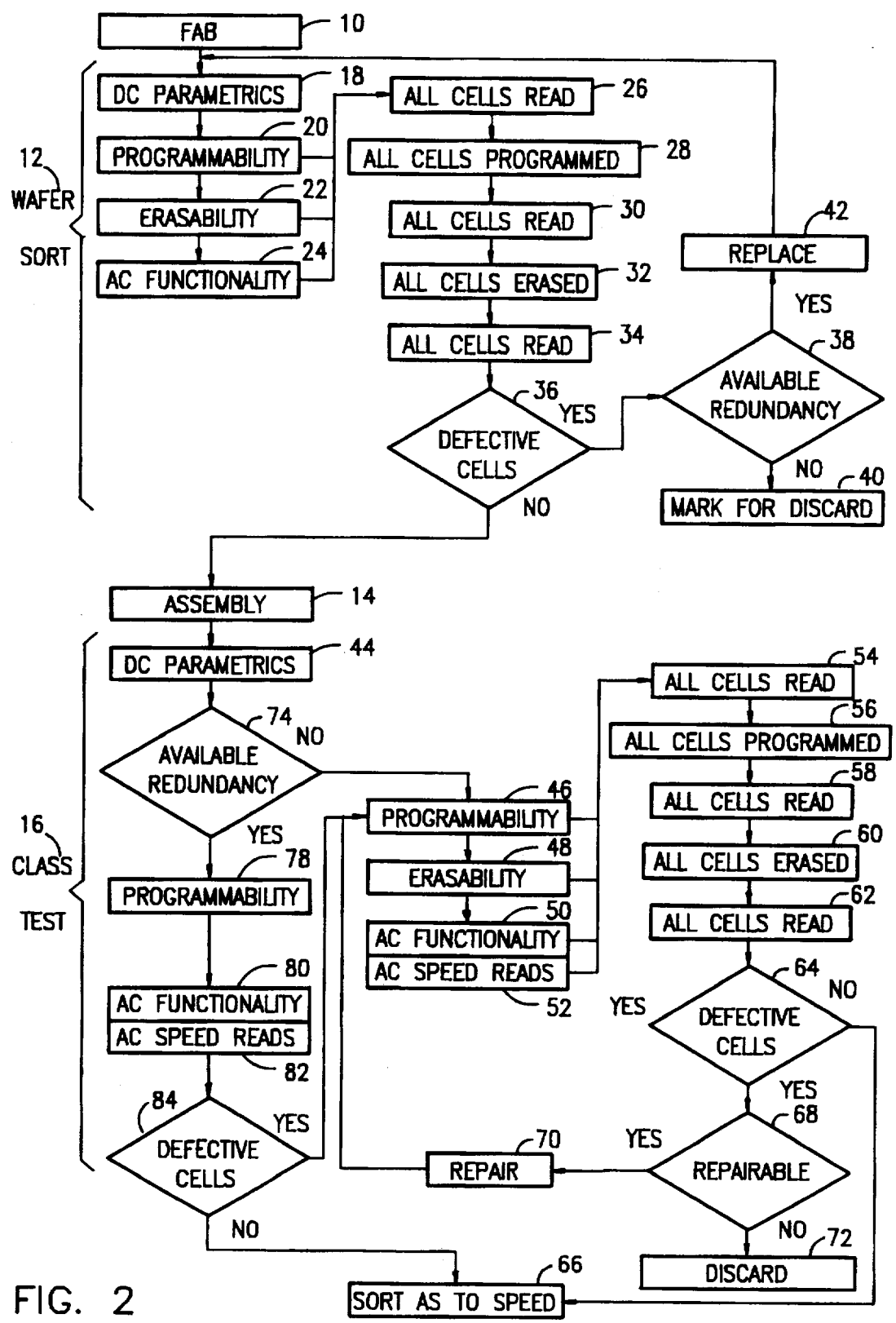

FIG. 2 shows the testing method of the present invention for Flash memory devices.

DETAILED DESCRIPTION

Referring now to FIG. 1 there is shown the prior art method of testing Flash memory devices. The manufacture of Flash memory devices can be informally divided into four overall processes. The first process is represented in FIG. 1 as fab 10 which represents the actual fabrication of the Flash memory device in wafer form. The next major process is referred to as wafer sort 12 which will be discussed in detail below. The third major process is referred to as the assembly process 14 and represents the process in which the wafer is sawed into individual die and each non-defective die, as determined in wafer sort 12, is packaged. The fourth major process is referred to as class test 16 and will be discussed in detail below.

The major tests performed in wafer sort 12 are the tests referred to as dc parametrics 18 for each cell which include testing for dc continuity, shorts, leakage current tests, etc., the programmability 20 of each cell, the erasability 22 of each cell, and the ac functionality 24 of each cell.

It has become standard practice to manufacture Flash memory devices with a main array section and a redundancy array section. The redundancy array section is a section comprising cells that are identical to the cells in the main array section and are used to replace defective cells identified in the main array during wafer sort. For example, the Advanced Micro Devices part Am28F020 is a 2 Megabit Flash memory device organized as 256 KBytes of 8 bits each. The 256 KBytes consist of an array of 1024 rows by 256 columns of bytes. Redundancy cells are manufactured in columns 8 bits wide and with a length the same as the main array columns. The number of columns depends upon the number of defective cells the manufacturer, through experience and statistical analysis collected for each manufacturing process, predicts will be identified during wafer sort. As can be appreciated, the more redundancy cells available will increase product yield, however, there is a point of diminishing returns because the die would have to be larger, and thus more costly to manufacture, to accommodate the larger number of redundancy cells.

Whenever a defective cell in the main array is identified during wafer sort 12 the defect is corrected by replacing the column containing the defective cell (disconnecting the defective column through special repair logic) with a column of redundancy cells (connecting the redundancy column through special repair logic). Thus, for example, if it is predicted statistically that there will be a certain number of defective cells, the designer will specify a certain number of redundancy cell columns based upon the predicted number. Typically, the number of redundancy cell columns needed is from 1–6.

The programmability test 20, the erasability test 22 and the ac functionality test 24 are all tested during a series of steps starting with a first step of all cells being read 26, a second step of all cells being programmed 28, all cells read again 30 to ensure that all cells are programmed. As noted above, it is crucial that all cells are programmed before the array is erased in order to protect against over-erasure which causes malfunctioning, including failure, of the device. After all cells are confirmed to be programmed the next step is an erasure of all cells 32. The cells are again read 34 to ensure that all cells have been erased. If any cell is not erased the steps must be repeated until all cells are erased.

In a Flash memory device, the programming of cells takes place a byte at a time, that is, 8 bits are programmed at a time. Therefore, in the example of the Advanced Micro Devices, Inc. part Am28F020 having 256 KBytes of main memory array plus a certain number of redundancy arrays there will be at least 256K units of programming time required to conduct the programming step for the main array. The read step is also done a byte at a time, therefore there will be an additional 256K units of read time to conduct each read step (also known as a verify step). As can be appreciated, if the read step indicates that there are cells that are not programmed there will be additional programming time necessary to ensure that all the cells are programmed. Once all the cells are verified as being programmed, all of the cells can be erased at the same time. However, there is another read (verify) step after the erase step to verify that all cells have been erased. As discussed above, the read step is done a byte at a time, therefore there will be another 256K read units of time necessary to verify that all cells have been erased. Again, as can be appreciated, if it is shown that there are cells that are not erased it will be necessary to repeat the above steps until all the cells are verified as being erased. If there are cells that cannot be either programmed or erased the device will be determined to be defective and the defective main array cells will be replaced by redundancy array cells. The minimum amount of time to run through a wafer sort for an Am28F020 2 Megabit Flash memory device is then:

3 times 256K units of read time (3 read steps-cells read a byte at a time);

256K units of programming time (cells programmed a byte at a time);

1 unit of erase time (all units erased at the same time).

If there are no defective cells identified at 36 during the above tests the die is passed to the assembly process 14. If there are defective cells identified at 36, a determination is made at 38 whether there are redundancy cells to replace the defective cells. If there are no redundancy cells available, the die is marked for discard 40. If there are available redundancy cells, the defective cells are repaired, at 42, and the tests necessary to ensure that the device is good are repeated.

After assembly process 14 is completed, class tests 16 are conducted. The individual die are now in packages and are again subjected to the full range of tests, however, during class testing 16 the tests are typically conducted at an elevated temperature. The packaged die are subjected to testing for dc parametrics 44, testing for programmability 46, testing for erasability 48, and testing for ac functionality 50 which includes ac speed reads 52. To complete the full range of tests it is necessary to expend the minimum amount of time as calculated above and repeated as follows:

3 times 256K units of read time (3 read steps-cells read a byte at a time);

256K units of programming time (cells programmed a byte at a time);

1 unit of erase time (all units erased at the same time).

The programmability test 44, the erasability test 46, and the ac functionality test 50 which includes the ac speed reads 52 are all tested during a series of steps starting with a first step of all cells being read 54, a second step of all cells being programmed 56, all cells read again 58 to ensure that all cells are programmed since it is crucial that all cells are programmed before the array is erased in order to protect against any cell being over-erased which would cause that cell to malfunction (a malfunction could involve a cell that programs, but either too rapidly or too slowly) or fail (a failure would include a cell that cannot be programmed). After all cells are confirmed as being programmed the next step is the erasure of all cells 60. After an erasure sequence, the cells are again read 62 to ensure that all cells have been erased. If any cell is not erased the erasure steps must be repeated until all cells are erased.

If there are no defective cells identified at 64 the device is sorted as to speed at 66 and are ready to be sent to a customer. If there are defective cells identified at 64, a determination is made whether the defective cell is repairable at 68 and, if so, the defective cell is repaired at 70 and those tests necessary to ensure that the device is good are redone. If it is determined at 68 that the device is not repairable, the device is discarded 72.

Referring now to FIG. 2 there is shown the methodology of testing Flash memory devices as taught by the present invention. As described above in reference to Figure i the manufacture of Flash memory devices can be divided into four overall processes. In the discussion relating to FIG. 2 like reference numerals will be used for like steps as shown in FIG. 1. The first process is represented in FIG. 2 as fab 10 which represents the actual fabrication of the Flash memory device in wafer form. The next major process is referred to as wafer sort 12 in which the wafers are tested and will be discussed in detail below. The third major process is referred to as the assembly process 14 and represents the process in which the wafer is sawed into individual dice and each non-defective die, as determined in wafer sort 12, is packaged. The fourth major process is referred to as class test 16 and will be discussed in detail below.

The major tests performed in wafer sort 12 are the dc parametrics 18 for each die which includes testing for dc continuity, shorts, leakage currents etc., testing the programmability 20 of each cell, testing the erasability 22 of each cell, and testing the ac functionality 24 of each cell.

As described above, each Flash memory device is made up of a main array section and a redundancy array section. The redundancy array section is a section comprising cells that are used for replacing defective cells identified in the main array during wafer sort or class test. Recalling the example given above, the Advanced Micro Devices part Am28F020 is a 2 Megabit Flash memory device and is organized as 256 KBytes of 8 bits each. The 256 KBytes consist of an array of 1024 rows by 256 columns of bytes. Redundancy cells are manufactured in columns 8 bits wide and with a length the same as the main array columns. The number of redundancy cell columns depends upon the number of defective cells that is predicted will be identified during wafer sort.

Whenever a defective cell in the main array is identified during wafer sort the defect is corrected by replacing the column containing the defective cell (disconnecting the column using special circuit logic) with a column of redundancy cells (connecting the column with special circuit logic) provided that there are redundancy cells available. Thus, for example, if it is predicted statistically that there will be a certain number of defective cells, the designer will specify a certain number of redundancy cell columns based upon the predicted number. Typically, the number of redundancy cell columns needed is from 1–6.

The programmability test 20, the erasability test 22 and the ac functionality test 24 are all tested during a series of steps starting with a first step of all cells being read 26, a second step of all cells being programmed 28, all cells read again 30 to ensure that all cells are programmed. As noted above, it is crucial that all cells are programmed before the array is erased in order to protect against over-erasure which causes malfunctioning, including failure, of the device. After all cells are confirmed as being programmed the next step is an erasure of all cells 32. The cells are again read 34 to ensure that all cells have been erased. If any cell is not erased the erasure sequence must be repeated until all cells are erased.

The minimum amount of time to perform the wafer sort test as taught by the present invention is the same as calculated above and is repeated as follows:

3 times 256K units of read time (3 read steps-cells read a byte at a time);

256K units of programming time (cells programmed a byte at a time);

1 unit of erase time (all units erased at the same time).

If there are no defective cells identified at 36 during the above tests the die is passed to the assembly process 14. If there are defective cells identified at 36, a determination is made at 38 whether there are redundancy cells to replace the defective cells. If no redundancy cells are available the die is marked for discard 40. If there are available redundancy cells, the defective cells are repaired, at 42, and the tests necessary to ensure that the device is good are repeated. Once the repaired cells are shown to be good they are passed to the assembly process 14.

After the assembly process 14 is completed, class tests 16 are conducted. As in the prior art method, the individual die are now in packages and are ready for final testing. However, the methodology as taught by the present invention teaches that it is not necessary to subject the packaged die to the full range of tests that were conducted in the wafer sort 12. When a packaged die has finished the assembly process 14 it is determined whether there are available redundancy cells at 74 after dc parametrics tests 44 are conducted. If there are available redundancy cells, the following tests are performed only on the redundancy cells: the programmability tests 78 and the ac functionality tests 80 which includes the ac speed reads 82. Once these tests have been conducted on the redundancy cells it is determined whether there are defective cells in the redundancy cells being tested at 84 which prevent an accurate determination of the programmability or speed of the device. If it is determined at 84 that there are no defective cells the device is sorted as to speed as indicated at 66. If it is determined at 84 that there are defective cells the device is then subjected to the sequence of testing starting at 46. This sequence of testing is the full range of class testing as described in the prior art.

During extensive testing to determine the correlation between results obtained from prior art methods in which all cells in the main array were tested and results according to the present invention in which only cells in available redundancies were tested it was found that if the "worst case scenario" was a pattern that a customer would use was programmed into the redundancies being tested that a correlation approaching 1 between results obtained from testing all the main array cells and results obtained from testing only the redundancy array cells could be obtained. If data is not available from a customer the "worst case pattern" is a full transition from "0" to "1" (programmed to erased) and repeating this pattern in successive transistors. Thus, the fact that redundancy cells are identical to main array cells can substantially cut down on testing time, since fewer cells are tested for programming and ac functionality and speed. An important factor to remember is that since the redundancy cells being tested do not reside in the main array, they do not have to be erased which saves additional test time. From data collected during evaluation of this test method, it was determined that over 95% of a typical production volume would benefit from the test method as taught by the present invention.

The purpose of the "worst case" pattern being programmed into the redundancy cells was to simulate all the worst case speed read patterns used for production on a smaller set of transistors. Lower voltages than standard were used during programming. $V_{CC}$ at 4–5 volts and $V_{PP}$ at 10.5–11.5 volts. After programming, the pattern that was programmed into the redundancy cells would be read at different voltages, speeds and speed read data patterns in order to determine the speed grade of the device. If parts were determined to be defective during tests involving redundancy cells and there were no alternative redundancy cells the parts would simply be re-tested in the standard production program by testing the main array cells to determine if the part was, in fact, defective.

To determine the speed of the device, the parts were read at different speeds to determine the speed grade of the device. By reading the selected pattern at various voltages and speeds, the speed grade of the part was determined. The voltages used for the speed reads are, on the low end 4–5 volts and on the high end 5.5–6 volts. By determining the speed grade, critical time parameters such as $T_{acc}$ (time to access the part), $T_{ce}$ (time to read part after the chip is enabled), and $T_{oe}$ (time to access the part after the outputs are enabled) are determined and are available for the end user to make a selection of the appropriate Flash memory device that would be suitable for a particular application.

In the event there are no available redundancy cells upon which to conduct class tests the standard class tests are conducted on the packaged die as described above in conjunction with FIG. 1 and wherein like numerals are used for like steps in FIGS. 1 and 2. The programmability test 46, the erasability test 48, and the ac functionality test 50 which includes the ac speed reads 52 are all tested during a series of steps starting with a first step of all cells being read 54, a second step of all cells being programmed 56, all cells read again 58 to ensure that all cells are programmed since it is crucial that all cells are programmed before the array is erased in order to protect against any cell being over-erased which would cause that cell to malfunction or fail. After all cells are confirmed to be programmed the next step is an erasure of all cells 60. The cells are again read 62 to ensure that all cells have been erased. If any cell is not erased the steps must be repeated until all cells are erased.

If there are no defective cells identified at 64 the device is sorted as to speed at 66 and are ready to be sent to a customer. If there are defective cells identified at 64, a determination is made whether the defective cell is repairable at 68 and if so the defective cells is repaired at 70 and those tests necessary to ensure that the device is good are redone. If it is determined at 68 that the device is not repairable, the device is discarded at 72.

The advantages of the present invention are now apparent. By doing class testing only on available redundancy cells there is a major savings in time by not having to test every cell in the main array of every device. For example, by not having to test every cell there is a savings of time, as follows, instead of having to expend 256K units of programming time, it will only be necessary to expend 1024 units of programming time (assuming that the column length is 1024 cells long), instead of having to expend 3 times 256K units of read time, it will only be necessary to expend 3 times 1024 units of read time. The situation in which the class test needs to be conducted on the redundancy cells should be rule and not the exception. The situation in which there are no available redundancy cells upon which to conduct the class tests will be very small and the complete class tests that will have to be conducted on the entire main array cells will be very small. Since the main array cells have already been tested previously at wafer sort, the percentage of die failure during class test compared to the prior art method is minimal. There is a major savings of time for testing of present Flash memory devices and there will be an increased savings of time for testing of future Flash memory devices as they become larger than the typical 1–2 Megabit sizes.

The foregoing description of the preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of testing Flash memory devices wherein the Flash memory devices comprise main array cells and redundancy array cells, wherein said method comprises the steps of:

performing wafer sort testing of the main array cells and the redundancy array cells of the Flash memory devices;

packaging the flash memory devices that pass the wafer sort testing, determining the availability of redundancy array cells after the packaging and wafer sort testing are performed;

performing class testing only on the redundancy array cells if redundancy array cells are available, wherein class testing on main array cells is not performed.

2. The method of testing of claim 1, wherein the step of performing class testing of the redundancy array cells comprises:

performing ac functionality testing including ac speed reads; and sorting the Flash memory device in accordance with the ac speed reads performed on the redundancy array cells.

3. The method of testing of claim 2, further comprising the step of testing for programmability of the redundancy array cells.

4. The method of claim 3, further comprising the step of performing class testing of main array cells if there are no redundancy array cells available for class testing.

5. The method of testing of claim 4, wherein said wafer sort testing of the main array cells and redundancy array cells comprise the steps of:

testing for dc parametrics of each Flash memory device;

testing for programmability of each Flash memory device;

testing for erasability of each Flash memory device; and testing for ac functionality of each Flash memory device.

6. The method of testing of claim 5, further comprising the step of repairing defective cells in the main array identified by the wafer sort testing.

7. The method of testing of claim 6, wherein said step of repairing defective cells in the main array is accomplished by the steps of:

determining whether there are redundancy array cells available; and replacing the defective cells in the main array with available redundancy array cells.

8. The method of testing of claim 7, further comprising the step of retesting the Flash memory devices that have been repaired.

9. The method of testing of claim 8, further comprising the step of marking die for discard if it is determined that there are no available redundancy array cells for the step of repairing.

10. The method of testing of claim 9, further comprising the steps of:

encapsulating non-defective Flash memory devices; and determining whether there are available redundancy array cells on which to perform class testing prior to the step of performing class testing of the redundancy array cells.

11. The method of testing of claim 10, further comprising the step of performing class testing on main array cells of each Flash memory device for which redundancy array cells were not available.

12. The method of testing of claim 11, wherein said step of performing class testing on main array cells of each Flash memory device for which redundancy array cells were not available, comprises the steps of:

testing for dc parametrics of each Flash memory device for which redundancy array cells were not available;

testing for programmability of each Flash memory device for which redundancy array cells were not available;

testing for erasability of each Flash memory device for which redundancy array cells were not available; and testing for ac functionality including ac speed reads for each Flash memory device for which redundancy array cells were not available.

13. The method of testing of claim 12, further comprising the step of determining whether there are repairable defective main array cells identified during class testing of the main array cells.

14. The method of testing of claim 13, further comprising the steps of:

repairing repairable defective main array cells; and retesting repaired main array cells.

15. The method of testing of claim 14, further comprising the step of marking for discard Flash memory devices containing non-repairable defective main array cells for which no redundancy cells were available.

16. The method of testing of claim 15, wherein the steps of testing for programmability, erasability, and ac functionality of each Flash memory device comprises the steps of:

reading each cell;

programming each cell;

rereading each cell;

erasing each cell; and rereading each cell.

* * * * *